(12) United States Patent
Wada et al.

(10) Patent No.: US 6,487,133 B2
(45) Date of Patent: Nov. 26, 2002

(54) SEMICONDUCTOR DEVICE

(75) Inventors: Masaharu Wada, Yokohama (JP); Kenji Tsuchida, Kawasaki (JP); Atsushi Takeuchi, Yokohama (JP)

(73) Assignees: Kabushiki Kaisha Toshiba, Kawasaki (JP); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/898,033

(22) Filed: Jul. 5, 2001

(65) Prior Publication Data

US 2002/0003737 A1 Jan. 10, 2002

(30) Foreign Application Priority Data

Jul. 5, 2000 (JP) ........................................ 2000-204104

(51) Int. Cl.$^7$ ................................................. G11C 7/00
(52) U.S. Cl. .................... 365/205; 365/226; 365/189.09
(58) Field of Search ................................. 365/205, 226, 365/189.09, 189.11, 207, 189.05

(56) References Cited

U.S. PATENT DOCUMENTS 6,169,698 B1 * 1/2001 Sukegawa et al. .......... 365/149

FOREIGN PATENT DOCUMENTS

JP          2000-57764           2/2000

* cited by examiner

*Primary Examiner*—David Lam
(74) *Attorney, Agent, or Firm*—Banner & Witcoff, Ltd.

(57) ABSTRACT

The present invention relates to overdrive circuits for generating an operational potential of a sense amplifier. For example, a switch circuit is used to connect a drive node of the sense amplifier with a overdrive potential generation circuit for generating an overdrive potential to be applied to bit lines. A restoration potential generation circuit comprises a push-pull regulator circuit for generating a restoration potential to be applied to bit lines. Consequently, the restoration potential generation circuit can directly connect with the sense amplifier's drive node.

22 Claims, 8 Drawing Sheets

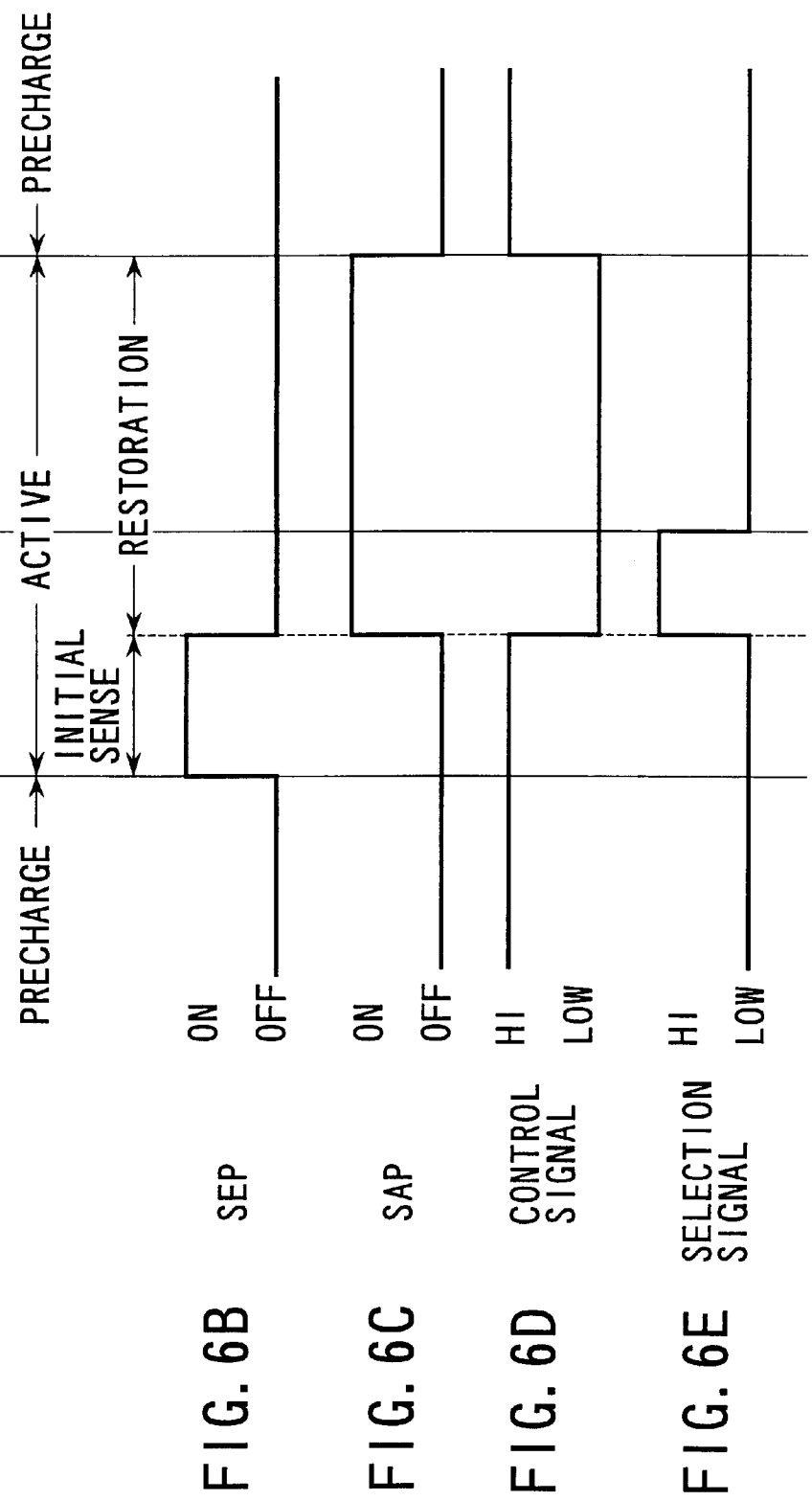

SEMICONDUCTOR DEVICE

CROSS-REFERENCE TO RELATED APPLICATIONS

This application is based upon and claims the benefit of priority from the prior Japanese Patent Application No. 2000-204104, filed Jul. 5, 2000, the entire contents of which are incorporated herein by reference.

BACKGROUND OF THE INVENTION

The present invention relates to a semiconductor device. More specifically, the invention relates to an overdrive power supply circuit used as a power supply circuit of a sense amplifier.

Conventionally, DRAM uses an overdrive power supply circuit (hereafter referred to as the overdrive circuit) for highly sensitive and fast sense operations. For a sense operation on a bit line, a sense amplifier's positive electrode is supplied with an electric potential (so-called overdrive potential) which is higher than a restoration potential for the bit line.

FIG. 12 shows a configuration example of a conventional overdrive circuit. In this figure, one external power supply (VCC) 101 connects with an overdrive potential generation circuit (VIIAG) 102. The other external power supply (VCC) 103 connects with a restoration potential generation circuit (VAAG) 104. The overdrive potential generation circuit 102 and the restoration potential generation circuit 104 connect with a switch circuit 105. The switch circuit 105 connects with a sense amplifier driver (PSAD) 106. The sense amplifier driver 106 connects with a sense amplifier (S/A) 107. The sense amplifier 107 connects with a sense amplifier driver (NSAD) 108. The sense amplifier driver 108 connects with an external power supply (GND) 109.

The overdrive potential generation circuit 102 generates an overdrive potential (VIIA) for overdriving (amplifying) an electric potential of the bit line during a sense operation. This overdrive potential is also used as a power for peripheral circuits. The restoration potential generation circuit 104 generates a restoration potential (VAA) for restoring an electric potential of the bit line after the overdrive. The switch circuit 105 selects one of the overdrive potential and the restoration potential, and supplies it to the sense amplifier driver 106.

FIG. 13 shows a configuration of the above overdrive circuit in more detail. The overdrive circuit needs to suppress output impedance. To configure the overdrive circuit using a MOS (Metal Oxide Semiconductor) transistor, a source follower (common drain amplifier) is used.

Normally, the overdrive potential generation circuit 102 and the restoration potential generation circuit 104 both generate a positive potential. Namely, the overdrive potential generation circuit 102 is configured by using an n-type MOS transistor 102a as a source follower. Namely, the restoration potential generation circuit 104 is configured by using an n-type MOS transistor 104a as a source follower.

The switch circuit 105 comprises p-type MOS transistors 105a and 105b. In this example, the p-type MOS transistors 105a and 105b also work as the sense amplifier driver 106.

The sense amplifier 107 comprises p-type MOS transistors 107a and 107b and n-type MOS transistors 107c and 107d. The p-type MOS transistor 107a and the n-type MOS transistor 107c share the drain and are connected serially. The p-type MOS transistor 107b and the n-type MOS transistor 107d share the drain and are connected serially. A bit line BLt is connected to a connection point between the p-type MOS transistor 107a and the n-type MOS transistor 107c and gates of the p-type MOS transistor 107b and the n-type MOS transistor 107d. A bit line BLc is connected to a connection point between the p-type MOS transistor 107b and the n-type MOS transistor 107d and gates of the p-type MOS transistor 107a and the n-type MOS transistor 107c. The bit line BLc is complementary to the bit line BLt.

The power supply line 110 connects the sense amplifier 107's positive electrode (connection point between sources of the p-type MOS transistors 107a and 107b) with the switch circuit 105 (connection point between drains of the p-type MOS transistors 105a and 105b). The sense amplifier driver 108 is connected to the sense amplifier 107's negative electrode (connection point between sources of the n-type MOS transistors 107c and 107d). The sense amplifier driver 108 comprises an n-type MOS transistor 108a.

FIG. 14 shows a layout structure of a DRAM memory core using the above overdrive circuit. Especially, the figure shows an arrangement of the overdrive circuit and its power supply wiring. AS shown in this figure, a plurality of cell arrays (cells) 111 is arranged in a matrix. The sense amplifiers 107 are placed on and under each cell array 111 along a row direction. The segment row decoders (SRD) 112 are placed to the right and left sides of each cell array 111 along a column direction. A circuit area (SSC1) 113 is provided at each intersection point between the sense amplifier 107 and the segment row decoder 112.

A memory core periphery (one end of the column direction) is provided with a main row decoder (MRD) 114 corresponding to each column for the cell array 111. A circuit area (SSC2) 115 is provided on and under each main row decoder 114 (row direction) corresponding to the circuit area 113.

A memory core periphery (one end of the row direction) is provided with a plurality of overdrive potential generation circuit blocks 116 and a plurality of restoration potential generation circuit blocks 117. In this example, each circuit block 116 comprises the overdrive potential generation circuit 102 (the n-type MOS transistor 102a) and the switch circuit 105 (the p-type MOS transistor 105a). Likewise, each circuit block 117 comprises the restoration potential generation circuit 104 (the n-type MOS transistor 104a) and the switch circuit 105 (the p-type MOS transistor 105b).

The circuit blocks 116 and 117 are connected to the sense amplifier 107 via the power supply line 110. The power supply line 110 comprises, say, a first-level metal wire 110a and a second-level metal wire 110b. The metal wire 110a connects with the sense amplifier 107's positive electrode. The metal wire 110b connects with the circuit blocks 116 and 117. The metal wire 110a and the metal wire 110b are connected with each other in the circuit area 115 and the sense amplifier 107.

However, the above configured overdrive circuit has the following problems.

1. An operation in a long RAS cycle requires a long restoration time. At this time, the potential level creeps, causing an excessively high restoration potential.

2. In the event of an excessive overdrive, there is a limited capability of decreasing an overdrive potential.

3. The overdrive potential generation circuit 102 is also used as the power supply circuit for the peripheral circuit. Because of this, a power supply noise during a sense operation propagates to the peripheral circuit.

4. There is a long distance between the restoration potential generation circuit 104 and the sense amplifier 107. It takes time to supply a restoration potential.

As mentioned above, the prior art can provide highly sensitive and fast sense operations. When a bit line potential after the overdrive becomes too low or high with reference to the restoration potential, however, it is difficult to control this potential to a desired potential.

BRIEF SUMMARY OF THE INVENTION

It is an object of the present invention to provide a semiconductor device which can stabilize a restoration potential level when the overdrive technique amplifies a bit line potential and the amplified bit line potential becomes too higher or lower than the restoration potential. It is also an object to provide a semiconductor apparatus which can easily control the overdriven bit line potential to a desired potential.

In order to attain the above objects, according to a first aspect of the present invention, there is provided a semiconductor device comprising: a sense amplifier for amplifying a bit line potential; a first generation circuit for generating an overdrive potential needed for a sense operation of the bit line according to the sense amplifier; a switch circuit for controlling supply of the overdrive potential to a positive electrode of the sense amplifier; and a second generation circuit comprising a push-pull regulator circuit connected to the positive electrode of the sense amplifier, wherein the second generation circuit generates a restoration potential of the overdriven bit line.

According to a second aspect of the present invention, there is provided a semiconductor device comprising: a plurality of memory cell blocks arranged in a matrix; a plurality of sense amplifiers for amplifying a bit line potential; a plurality of main row decoders for controlling drive of one main word line for controlling selection of a plurality of word lines; a plurality of segment row decoders driven by selecting a specific word line from the plurality of word lines corresponding to the one main word line; a plurality of first generation circuits for generating an overdrive potential needed for a sense operation of the bit line according to the plurality of sense amplifiers; a plurality of switch circuits for controlling supply of the overdrive potential to respective positive electrodes of the plurality of sense amplifiers; and a plurality of second generation circuits comprising push-pull regulator circuits respectively connected to positive electrodes of the plurality of sense amplifiers, wherein the plurality of second generation circuits generate a restoration potential for the bit line after overdrive, wherein the plurality of memory cell blocks and the plurality of sense amplifiers are alternately arranged in a first direction; the plurality of segment row decoders are arranged respectively adjacent to the plurality of memory cell blocks in a second direction orthogonal to the first direction; the plurality of main row decoders are arranged at one end of the second direction; the plurality of switch circuits are arranged in a plurality of first regions adjacent to the plurality of sense amplifiers; the plurality of first generation circuits are arranged at one end of the first direction; and the plurality of second generation circuits are arranged in a plurality of second regions adjacent to the plurality of main row decoders.

According to the semiconductor device of the present invention, the restoration potential can be driven to be positive or negative. This can suppress potential level inconsistency of the restoration potential due to overdrive timing inconsistency.

Especially, the second generation circuit can be directly connected to the sense amplifier's positive electrode. This can decrease resistance between the sense amplifier and the regulator circuit. It is possible to speed up a supply of the restoration potential to the bit line.

The first generation circuit can be configured through the use of a dedicated power supply circuit which is independent of a power supply circuit for driving a peripheral circuit. In this case, it is possible to prevent a power supply noise from being propagated to the peripheral circuit during a sense operation.

Since the regulator circuit is provided near the sense amplifier, it is possible to further decrease resistance between the sense amplifier and the regulator circuit. Therefore, it is possible to further speed up a supply of the restoration potential to the bit line.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principle of the invention.

FIGS. 6A to 6E are timing charts explaining operations of the regulator circuit;

DETAILED DESCRIPTION OF THE INVENTION

Embodiments of the present invention will now be described with reference to the accompanying drawings.

(First Embodiment)

Figure 1:
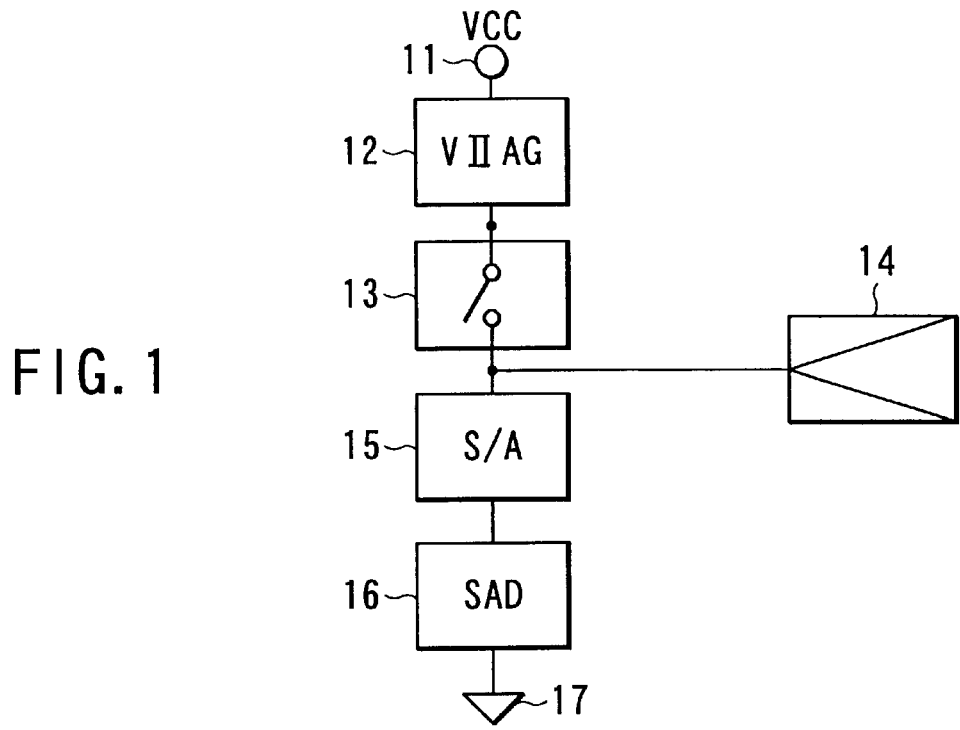
FIG. 1 is a block diagram showing a configuration example of an overdrive circuit according to a first embodiment of the present invention.

FIG. 1 shows a configuration example of an overdrive power supply circuit (hereafter referred to as the overdrive circuit) according to the first embodiment of the present invention. In this example, the power supply circuit is used for a sense amplifier in DRAM.

In this figure, an external power supply (VCC) 11 connects with an overdrive potential generation circuit (VIIAG) 12 as a first generation circuit. The overdrive potential generation circuit 12 connects with a switch circuit 13. The switch circuit 13 connects with a regulator circuit (second generation circuit) 14 and a sense amplifier (S/A) 15. The sense amplifier 15 connects with a sense amplifier driver (SAD) 16. The sense amplifier driver 16 connects with an external power supply (GND) 17.

The overdrive potential generation circuit 12 is a dedicated power supply circuit. It generates an overdrive potential (VII) for overdriving a bit line potential during a sense operation. The switch circuit 13 provides control to supply the overdrive potential to a positive electrode (SAP) of the sense amplifier 15. The regulator circuit 14 generates a restoration potential (VAA) for restoring a bit line potential after the overdrive. The restoration potential can be driven to be positive or negative. The sense amplifier 15 applies the overdrive potential higher than the restoration potential to the bit line during a sense operation (initial sense). After the overdrive, the bit line potential is controlled with a restoration potential.

Figure 2:
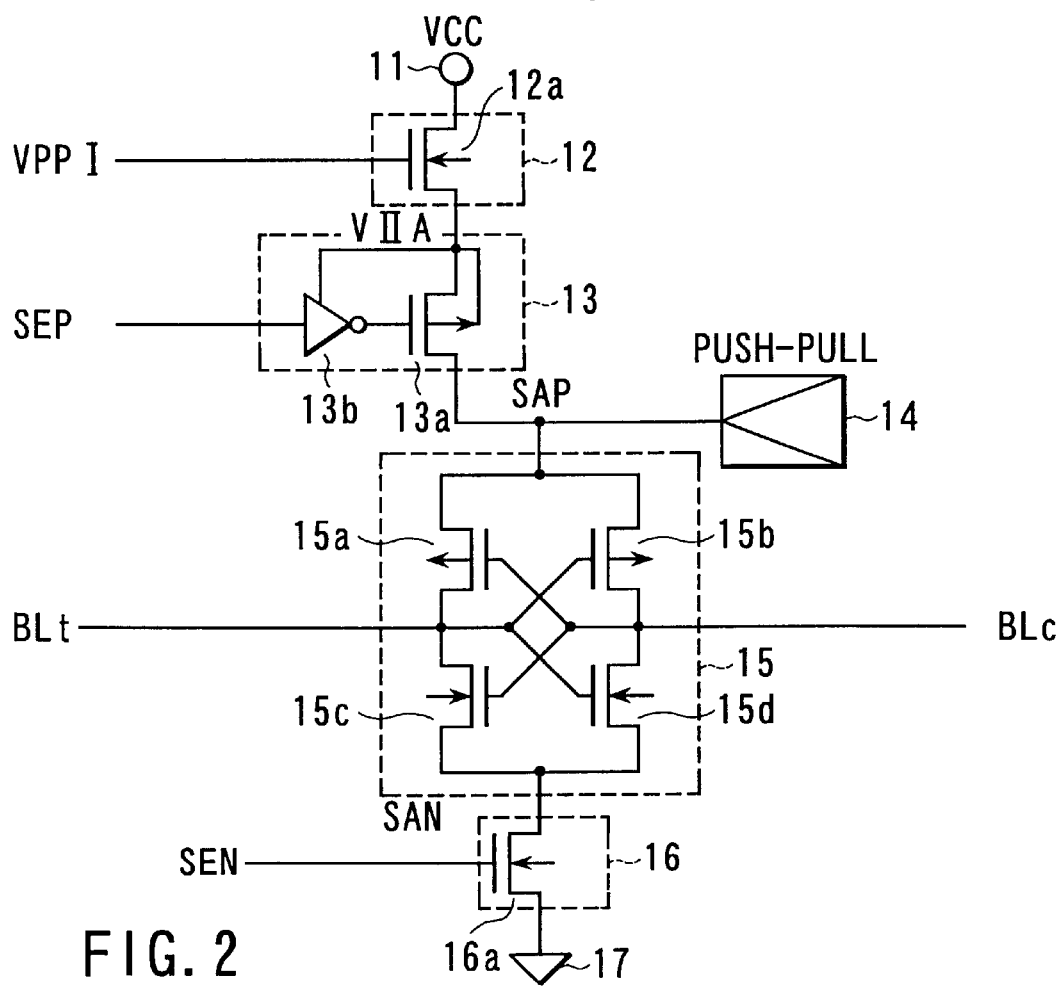
FIG. 2 is a circuit diagram showing a specific configuration of the overdrive circuit.

FIG. 2 shows a configuration of the overdrive circuit in further detail. In this figure, the overdrive potential generation circuit 12 is configured by using an n-type MOS transistor 12a as a source follower. The switch circuit 13 comprises a p-type MOS transistor 13a and a driver 13b for driving this transistor 13a. The regulator circuit 14 is configured to be a push-pull circuit for stabilizing a restoration potential. The regulator circuit 14 will be detailed later.

The sense amplifier 15 comprises p-type MOS transistors 15a and 15b and n-type MOS transistors 15c and 15d. The p-type MOS transistor 15a and the n-type MOS transistor 15c share the drain and are connected serially. The p-type MOS transistor 15b and the n-type MOS transistor 15d share the drain and are connected serially. A bit line BLt is connected to a drain connection point between the p-type MOS transistor 15a and the n-type MOS transistor 15c and gates of the p-type MOS transistor 15b and the n-type MOS transistor 15d. A bit line BLc is connected to a drain connection point between the p-type MOS transistor 15b and the n-type MOS transistor 15d and gates of the p-type MOS transistor 15a and the n-type MOS transistor 15c. The bit line BLc is complementary to the bit line BLt.

The sense amplifier 15's positive electrode SAP (connection point between sources of the p-type MOS transistors 15a and 15b) is connected with the switch circuit 13 (the p-type MOS transistor 13a's drain) and the regulator circuit 14. The sense amplifier driver 16 is connected with the sense amplifier 15's negative electrode SAN (connection point between sources of the n-type MOS transistors 15c and 15d). The sense amplifier driver 16 comprises an n-type MOS transistor 16a.

Figure 3:
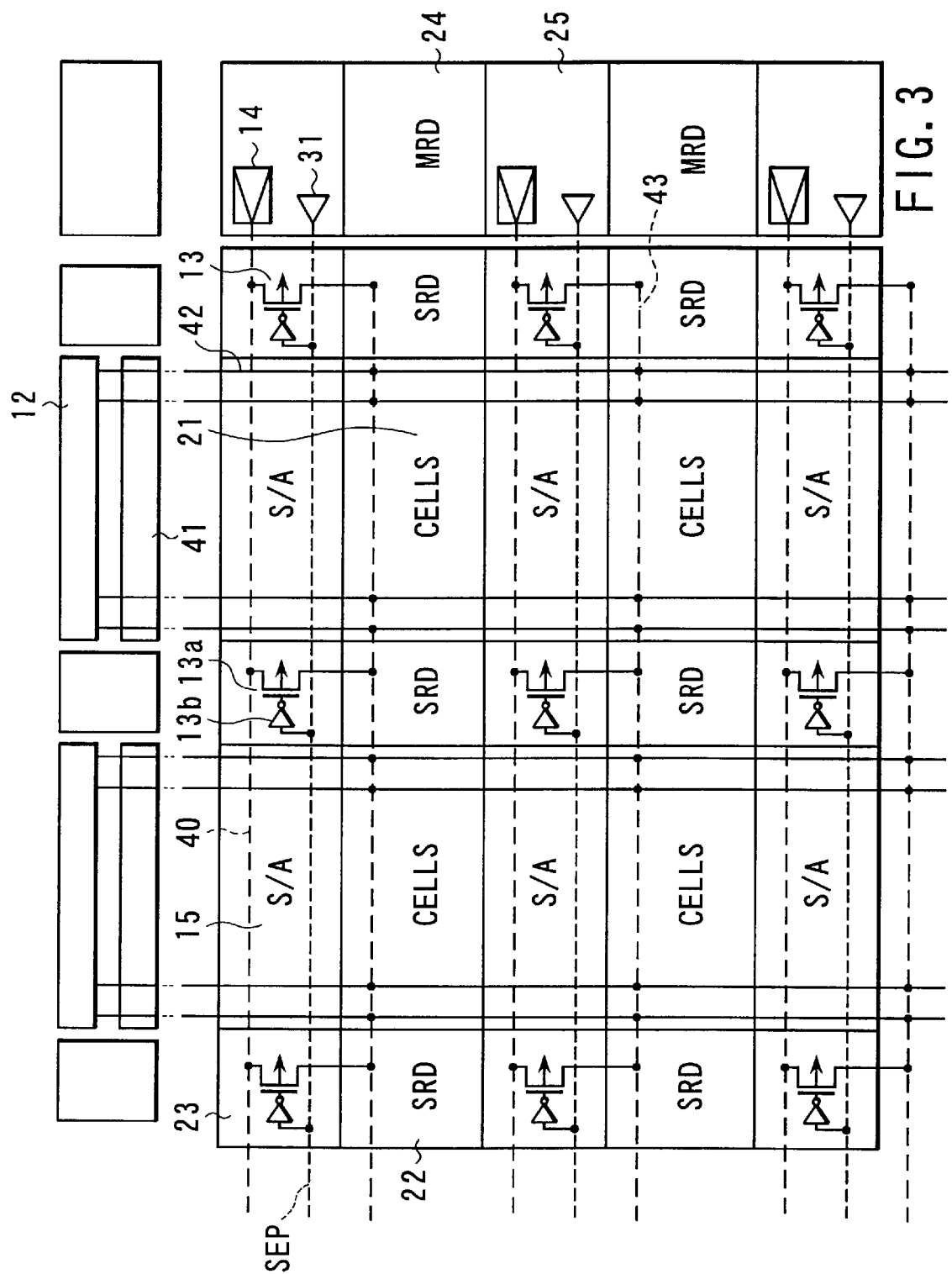
FIG. 3 is a plan view of a DRAM memory core showing an arrangement example of the overdrive circuit and its power supply wiring.

FIG. 3 shows a layout structure of a DRAM memory core using the above overdrive circuit. Especially, the figure shows an arrangement of the overdrive circuit and its power supply wiring. As shown in this figure, a plurality of cell arrays (cells) 21 as memory cell blocks is arranged in a matrix. The sense amplifiers 15 are placed on and under each cell array 21 along a row direction. The segment row decoders (SRD) 22 are placed to the right and left sides of each cell array 21 along a column direction. A first circuit area (first area) 23 is provided at each intersection point between the sense amplifier 15 and the segment row decoder 22. The switch circuit 13 is arranged in the first circuit area 23.

A memory core periphery (one end of the column direction) is provided with a main row decoder (MRD) 24 corresponding to each column for the cell array 21. A second circuit area (second area) 25 is provided on and under each main row decoder 24 (row direction) corresponding to the first circuit area 23.

The second circuit area 25 is provided with the regulator circuit 14 and a driver circuit 31. The driver circuit 31 drives a signal line SEP leading to the driver 13b of the switch circuit 13. The regulator circuit 14 is connected to a power supply line (say, a first-level metal wire) 40 leading to the switch circuit 13 (the p-type MOS transistor 13a's drain).

A memory core periphery (lone end of the row direction) is provided with a plurality of the overdrive potential generation circuits 12 and a plurality of internal power supply potential generation circuits 41 for the peripheral circuit. The overdrive potential generation circuit 12 is connected to the switch circuit 13 (the p-type MOS transistor 13a's source) via a power supply line (say, a second-level metal wire) 42 and a power supply line (say, a first-level metal wire) 43.

This configuration allows the regulator circuit 14 to be distributively placed near the sense amplifier 15. This makes it possible to decrease resistance between the regulator circuit 14 and the sense amplifier 15. Accordingly, a restoration potential can be fast supplied to the bit lines BLt and BLc.

Figure 4:
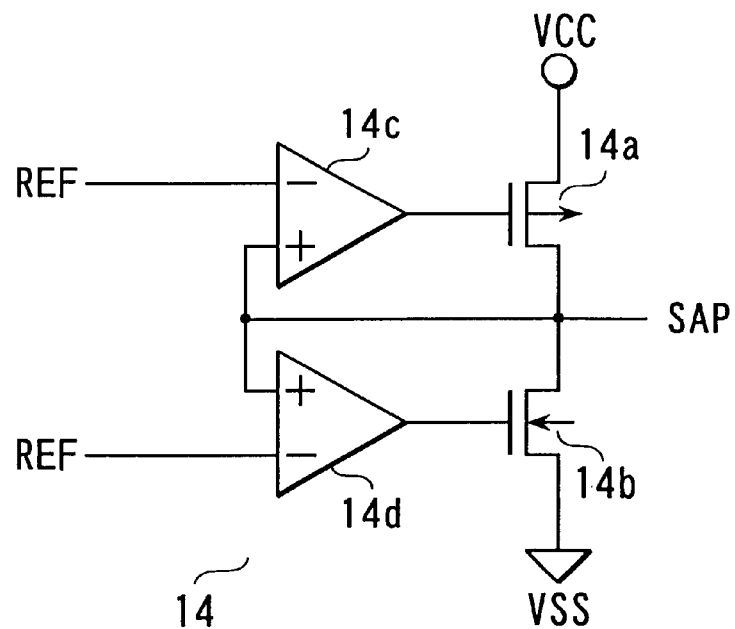
FIG. 4 shows a configuration example of a regulator circuit in the overdrive circuit.

FIG. 4 shows a configuration example of the regulator circuit 14. A p-type MOS transistor 14a and an n-type MOS transistor 14b share the drain and are serially connected between a power-supply voltage VCC and a ground voltage VSS.

The p-type MOS transistor 14a's gate connects with an operational amplifier 14c's output terminal. The n-type MOS transistor 14b's gate connects with an operational amplifier 14d's output terminal. Inverting input terminals of the operational amplifiers 14c and 14d are supplied with ref potentials for controlling a restoration potential which:is a circuit output. Non-inverting input terminals of the operational amplifiers 14c and 14d are commonly connected to a connection point for sources of the p-type MOS transistor 14a and the n-type MOS transistor 14b. This connection point is connected to the sense amplifier 15's positive electrode SAP.

The regulator circuit 14 is configured like a push-pull circuit as mentioned above. Consequently, even if potentials of the bit lines BLt and BLc after the overdrive become too low or high with reference to the restoration potential, it is possible to easily control these potentials to a desired potential.

Figure 5:
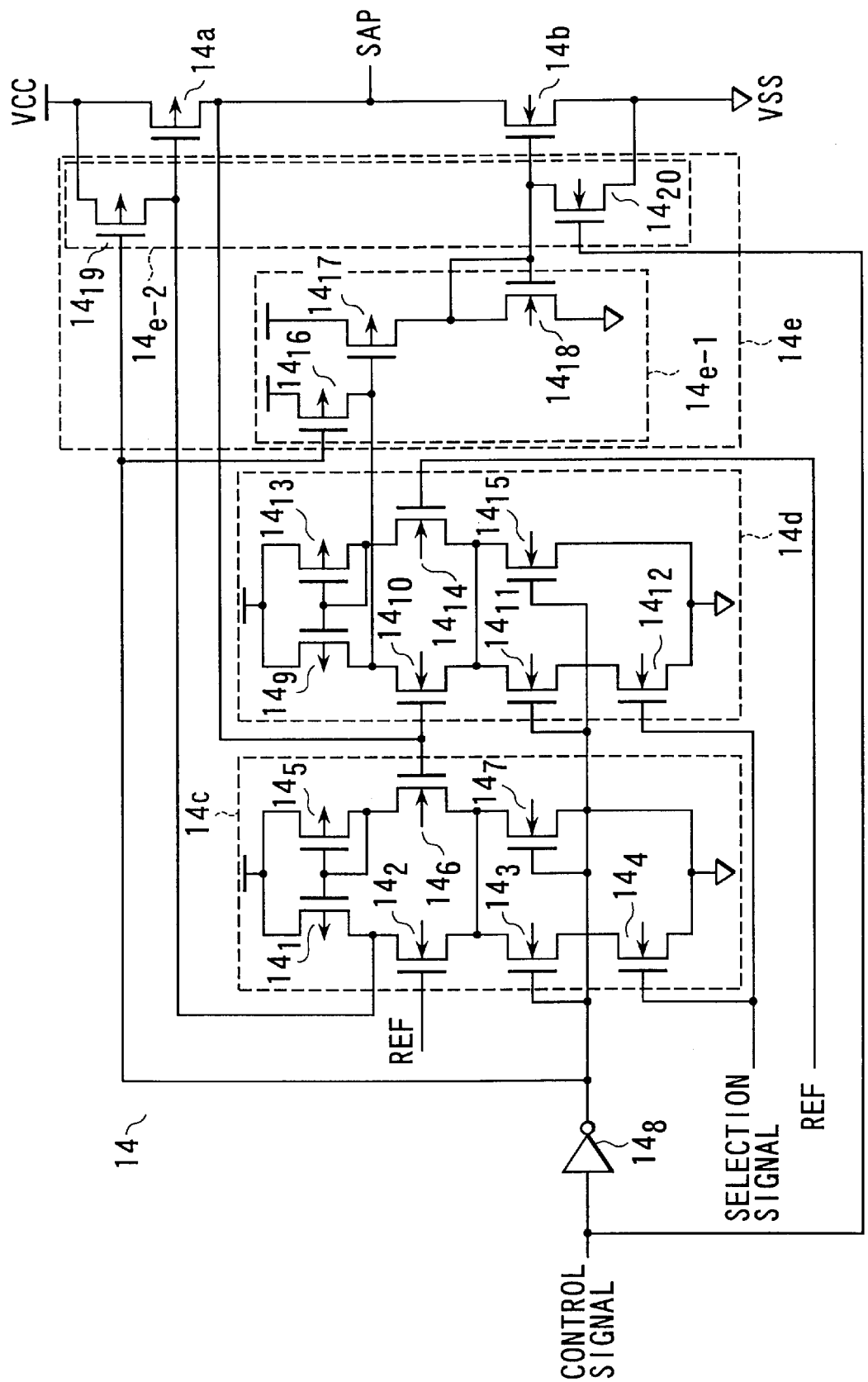
FIG. 5 is a specific circuit diagram of the regulator circuit in FIG. 4.

FIG. 5 diagrams the configuration of the regulator circuit 14 in more detail. As shown in the figure, the operational amplifier 14c comprises serially connected p-type MOS transistor $14_1$, n-type MOS transistor $14_2$, $14_3$, and $14_4$ and serially connected p-type MOS transistor $14_5$, n-type MOS transistor $14_6$ and $14_7$. A set of the transistors $14_1$ to $14_4$ and a set of the transistors $14_5$ to $14_7$ are parallel connected between the power-supply voltage and the ground voltage. The transistor $14_1$'s gate and the transistor $14_5$'s gate are commonly connected. The corresponding connection point is connected to a connection point between the transistor $14_5$'s drain and the transistor $14_6$'s drain. A connection point is common to the transistor $14_2$'s source and the transistor $14_3$'s drain. A connection point is common to the transistor $14_6$'s source and the transistor $14_7$'s drain. A connection point between the transistor $14_1$'s drain and the transistor $14_2$'s drain is connected to the transistor $14a$'s gate. The transistor $14_2$'s gate becomes an inverting input terminal of the operational amplifier $14c$ and is supplied with the ref potential. An output to the sense amplifier 15's positive electrode SAP is input to the transistor $14_6$'s gate which becomes a non-inverting input terminal of the operational amplifier $14c$.

The transistors $14_3$ and $14_7$ control a bias current for the operational amplifier $14c$. Gates of the transistors $14_3$ and $14_7$ are supplied with an inverting signal for the control signal which controls regulator circuit 14's operations via an inverter $14_8$. The transistor $14_4$'s gate is supplied with a selection signal for turning on or off the transistor $14_4$.

On the other hand, the operational amplifier $14d$ comprises serially connected p-type MOS transistor $14_9$, n-type MOS transistor $14_{10}$, $14_{11}$, and $14_{12}$ and serially connected p-type MOS transistor $14_{13}$, n-type MOS transistor $14_{14}$ and $141_{15}$. A set of the transistors $14_9$ to $14_{12}$ and a set of the transistors $14_{13}$ to $14_{15}$ are parallel connected between the power-supply voltage and the ground voltage. The transistor $14_9$'s gate and the transistor $14_{13}$'s gate, are commonly connected. The corresponding connection point is connected to a connection point between the transistor $14_{13}$'s drain and the transistor $14_{14}$'s drain. A connection point is common to the transistor $14_{10}$'s source and the transistor $14_{15}$'s drain. A connection point is common to the transistor $14_{14}$'s source and the transistor $14_{15}$'s drain. The transistor $14_{14}$'s gate becomes an inverting input terminal of the operational amplifier $14d$ and is supplied with the ref potential. An output to the sense amplifier 15's positive electrode SAP is input to the transistor $14_{10}$'s gate which becomes an inverting input terminal of the operational amplifier $14d$. Namely, the transistor $14_{10}$'s gate is connected to the transistor $14a$'s drain.

The transistors $14_{11}$ and $14_{15}$ control a bias current for the operational amplifier $14d$. Gates of the transistors $14_{11}$ and $14_{15}$ are supplied with an inverting signal for the control signal which controls regulator circuit 14's operations via an inverter $14_8$. The transistor $14_{12}$'s gate is supplied with the selection signal for turning on or off the transistor $14_{12}$.

The regulator circuit 14 further comprises a common circuit section $14e$. The common circuit section $14e$ comprises a polarity changeover circuit $14e$-1 and a connection circuit $14e$-2. The polarity changeover circuit $14e$-1 comprises p-type MOS transistors $14_{16}$ and $14_{17}$ and an n-type MOS transistor $14_{18}$. The p-type MOS transistor $14_{16}$'s gate is connected to the inverter circuit $14_8$'s output terminal. The transistor $14_{16}$'s source is connected to the power-supply voltage. The drain is connected to the connection point between the transistor $14_9$'s drain and the transistor $14_{10}$'s drain, and the p-type MOS transistor $14_{17}$'s gate. The p-type MOS transistor $14_{17}$'s source is connected to the power-supply voltage. The drain is connected to the n-type MOS transistor $14_{18}$'s drain and gate. The n-type MOS transistor $14_{18}$'s gate is connected to the transistor $14b$'s gate. The source is connected to the ground voltage.

The connection circuit $14e$-2 comprises a p-type MOS transistor $14_{19}$ and an n-type MOS transistor $14_{20}$. The p-type MOS transistor $14_{19}$'s gate is connected to the inverter circuit $14_8$'s output terminal and the transistor $14_{16}$'s gate. The transistor $14_{19}$'s source is connected to the power-supply voltage and the transistor $14a$'s source. The drain is connected to the connection point between the transistor $14_1$'s drain and the transistor $14_2$'s drain, and the transistor $14a$'s gate. The n-type MOS transistor $14_{20}$'s gate is connected to the inverter circuit $14_8$'s input terminal. The gate is supplied with the control signal for controlling the regulator circuit 14's operations. The transistor $14_{20}$'s drain is connected to the connection point between the transistor $14_{18}$'s gate and the transistor $14b$'s gate. The source is connected to the transistor $14b$'s source and the ground voltage.

As shown in FIGS. 6A to 6E, for example, the control signal controls operations of the thus configured regulator circuit 14. When the control signal has a high potential (Hi), the circuit 14's output becomes a high impedance. At this time, the regulator circuit 14 is disconnected from the sense amplifier 15 by the switch (connection circuit $14e$-2).

For decreasing a breakthrough current at the transistors $14a$ and $14b$, the ref potential supplies the transistor $14_2$ with a lower potential and transistor $14_{14}$ with a higher potential than the specified restoration potential. For setting the restoration potential to 1.4V, the transistor $14_2$ is supplied with the 1.38V ref potential. The transistor $14_{14}$ is supplied with 1.42V ref potential. In this case, the restoration potential causes a dead zone of 1.4V±20 mV.

To speed up operations of the regulator circuit 14, bias currents for the operational amplifiers $14c$ and $14d$ are increased. The bias current is increased at an initial stage of the restoration and is decreased after completion of the restoration. This increases an operation speed and saves the current consumption at the same time. The regulator circuit 14 is configured so that the transistors $14_3$ and $14_{11}$ are large sized for generating a large amount of electric current. When a selection signal (high potential) turns on the transistors $14_4$ and $14_{12}$, bias currents for the operational amplifiers $14c$ and $14d$ flow from the current paths of the transistors $14_4$ and $14_{12}$. By contrast, when a selection signal (low potential) turns off the transistors $14_4$ and $14_{12}$, bias currents for the operational amplifiers $14c$ and $14d$ flow from the current paths of the transistors $14_7$ and $14_{15}$. The transistors $14_7$ and $14_{15}$ can be small-sized. This also increases an operation speed and saves the current consumption.

The thus configured regulator circuit 14 provides a high impedance except when the restoration potential is supplied. The regulator circuit 14 can be directly connected to the sense amplifier 15's drive node (SAP) without using the switch circuit 13. This makes it possible to decrease resistance between the regulator circuit 14 and the sense amplifier 15. Accordingly, it is possible to shorten the time for supplying the restoration potential and shorten the restoration time.

As mentioned above, the restoration potential can be driven to be positive or negative. Namely, the push-pull regulator circuit is used for generating a restoration potential. This suppresses potential level inconsistency of the restoration potential due to overdrive timing inconsistency. The restoration potential level can be stabilized even when the bit line potential becomes too higher or lower than the restoration potential after the overdrive technique is used to amplify the bit line potential. Accordingly, it is possible to easily control the bit line potential after the overdrive to a desired potential.

Especially, the regulator circuit can be directly connected to the sense amplifier's positive electrode. This can decrease resistance between the sense amplifier and the regulator circuit. As a result, it is possible to shorten the time to supply the restoration potential and shorten the restoration time.

Since the regulator circuit is provided near the sense amplifier, it is possible to further decrease resistance between the sense amplifier and the regulator circuit. Therefore, it is possible to further speed up a supply of the restoration potential to the bit line and further shorten the restoration time.

The overdrive potential generation circuit is configured through the use of a dedicated power supply circuit which is independent of a power supply circuit (internal power supply potential generation circuit) for driving the peripheral circuit. This prevents a power supply noise from being propagated to the peripheral circuit during a sense operation.

Figure 7:
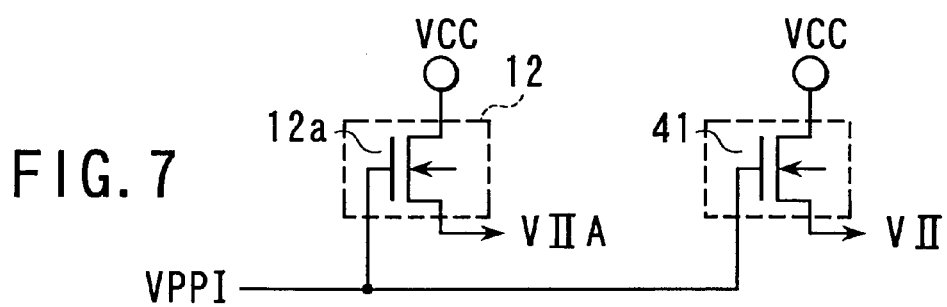
FIG. 7 is a circuit diagram showing configuration of an overdrive potential generation circuit and an internal power supply potential generation circuit using different power supply circuits in the overdrive circuit.

With reference to FIG. 7, the following describes a configuration example of the overdrive potential generation circuit using the dedicated power supply circuit independently of the internal power supply potential generation circuit for the peripheral circuit. For example, the dedicated power supply circuit (n-type MOS transistor 12a) is used independently of internal power supply potential generationcircuit (n-type MOS transistor) 41 for generating a peripheral circuit's drive potential VII. When the overdrive potential generation circuit 12 is configured by using this dedicated power supply circuit, it is possible to isolate mutually occurring noises. Accordingly, it is possible to prevent a power supply noise during the sense operation from being propagated to the peripheral circuit.

The configuration of FIG. 3 shows that the internal power supply potential generation circuit 41 is provided near the overdrive potential generation circuit 12. In this case, the overdrive potential generation circuit 12 and the internal power supply potential generation circuit 41 can share a signal line (VPPI) for potential control as shown in FIG. 7.

Figure 8:
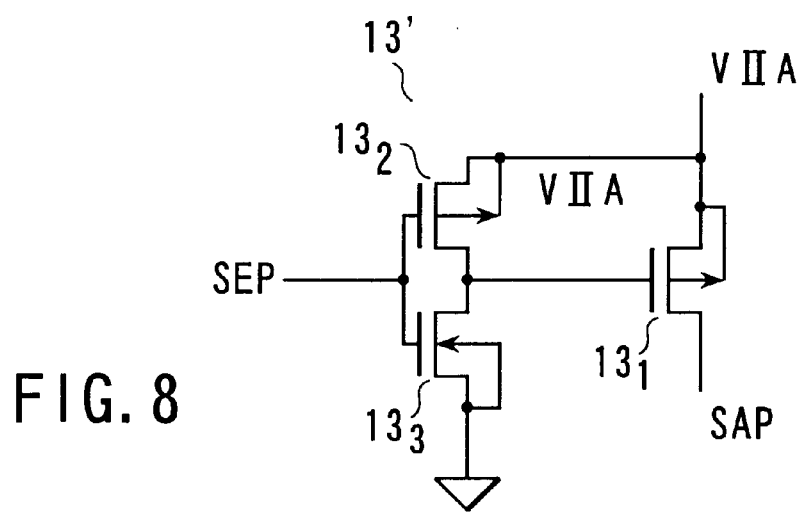
FIG. 8 is a circuit diagram of a switch circuit when different power supply circuits are used for configuring the overdrive potential generation circuit and the internal power supply potential generation circuit.

FIG. 8 is another configuration example of the switch circuit 13. Described below is the example in which a drive potential VII of the peripheral circuit differs from an overdrive potential VIIA. In a switch circuit 13', the overdrive potential VIIA is supplied to a p-type MOS transistor $13_1$ whose source is connected to a back gate. A p-type MOS transistor $13_2$ controls the transistor $13_1$. The overdrive potential VIIA is supplied to the transistor $13_2$'s source which is also connected to the back gate. An n-type MOS transistor $13_3$'s gate is commonly connected to the transistor $13_2$'s gate and is connected to the signal line SEP. The drain is commonly connected to the transistor $13_2$'s drain. The drain is connected to the ground voltage and the back gate. Each source's connection point is connected to the transistor $13_1$'s gate. This configuration can prevent a leak current along a forward junction direction of the transistors $13_1$, $13_2$, and $13_3$.

As mentioned above, the first embodiment of the present invention configures the regulator circuit using the push-pull circuit. The regulator circuit is not limited to the configuration in FIG. 4 and can be configured by using a push-pull circuit having another configuration.

(Second Embodiment)

Figure 9:
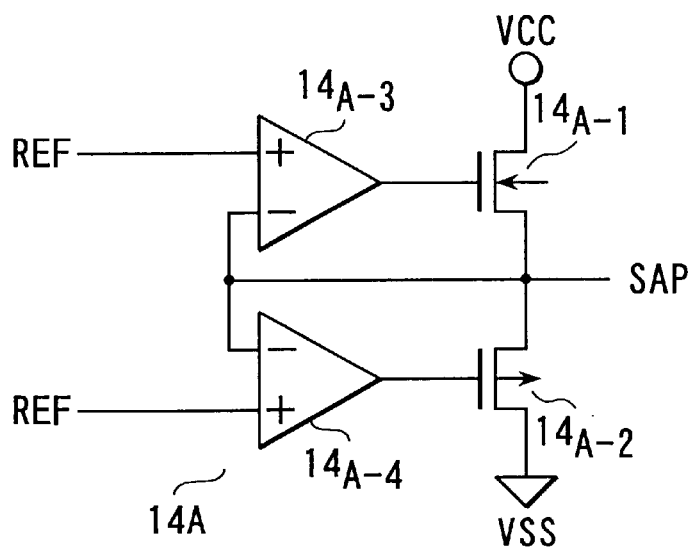
FIG. 9 is a configuration example of a regulator circuit according to a second embodiment of the present invention.

FIG. 9 relates to the second embodiment of the present invention and shows a configuration of the regulator circuit using a push-pull circuit of the source follower type. In the regulator circuit 14A, an n-type MOS transistor $14_{A-1}$ and a p-type MOS transistor $14_{A-2}$ share the source and are serially connected to each other between a power-supply voltage VCC and a ground voltage VSS. The n-type MOS transistor $14_{A-1}$'s gate connects with an output terminal of an operational amplifier $14_{A-3}$. The p-type MOS transistor $14_{A-2}$'s gate connects with an output terminal of an operational amplifier $14_{A-4}$. Non-inverting input terminals of the operational amplifiers $14_{A-3}$ and $14_{A-4}$ are supplied with the ref potential for controlling the restoration potential as a circuit output.. Inverting input terminals of the operational amplifiers $14_{A-3}$ and $14_{A-4}$ are commonly connected to the connection point between the sources of the n-type MOS transistor $14_{A-1}$ and the p-type MOS transistor $14_{A-2}$. This connection point is connected to the positive electrode SAP of the sense amplifier 15. When the thus configured regulator circuit 14A is used, the overdrive circuit can also provide similar effects as described for the first embodiment.

(Third Embodiment)

Figure 10:
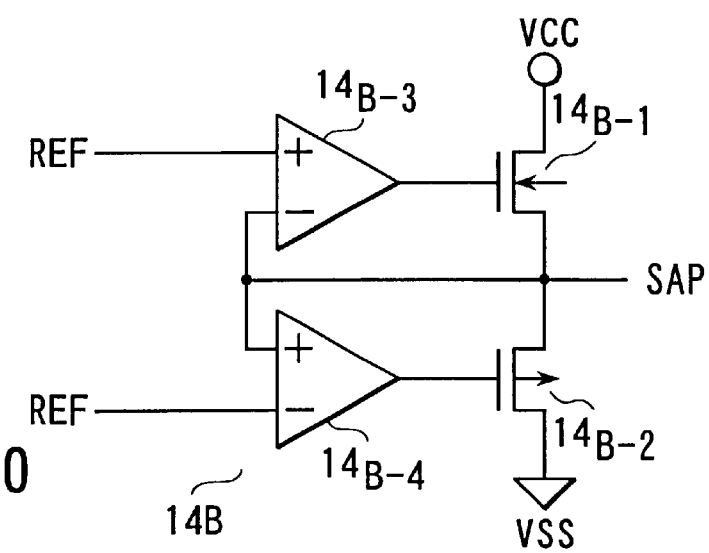
FIG. 10 is a configuration example of a regulator circuit according to a third embodiment of the present invention.

FIG. 10 relates to the third embodiment of the present invention and shows a configuration of the regulator circuit using a push-pull circuit having the totem pole structure. In this regulator circuit 14B, an n-type MOS transistor $14_{B-1}$ of the source follower type and an n-type MOS transistor $14_{B-2}$ of the source-common type are serially connected to form the totem pole structure between a power-supply voltage VCC and a ground voltage VSS. The n-type MOS transistor $14_{B-1}$'s gate connects with an output terminal of an operational amplifier $14_{B-3}$. The n-type MOS transistor $14_{B-2}$'s gate connects with an output terminal of an operational amplifier $14_{B-4}$. The operational amplifier $14_{B-3}$'s non-inverting input terminal and the operational amplifier $14_{B-4}$'s inverting input terminal are commonly connected. The corresponding connection point is supplied with the ref potential for controlling the restoration potential as a circuit output. The operational amplifier $14_{B-3}$'s inverting input terminal and the operational amplifier $14_{B-4}$'s non-inverting input terminal are commonly connected to the connection point for the n-type MOS transistors $14_{B-1}$ and $14_{B-2}$. This connection point is connected to the sense amplifier 15's positive electrode SAP. When the thus configured regulator circuit 14B is used, the overdrive circuit can also provide similar effects as described for the first embodiment.

(Fourth Embodiment)

Figure 11:
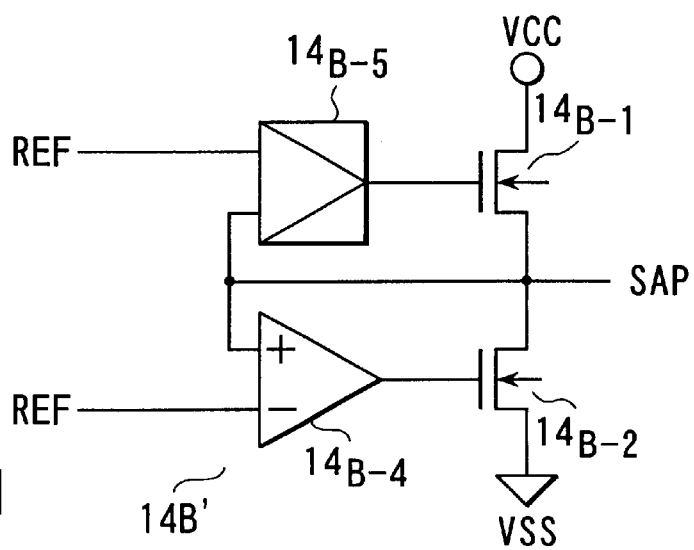
FIG. 11 is a configuration example of a regulator circuit according to a fourth embodiment of the present invention.
Figure 12:
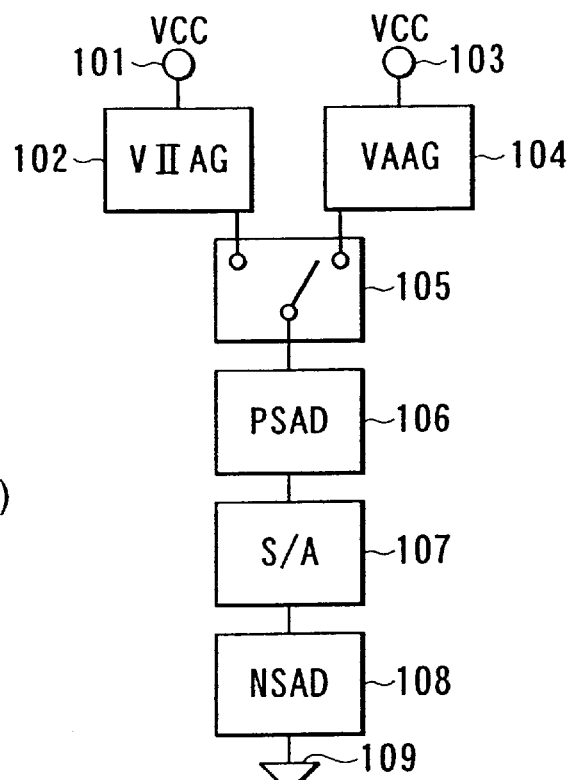
FIG. 12 is a block diagram of an overdrive circuit for explaining the prior art and its problems.
Figure 13:
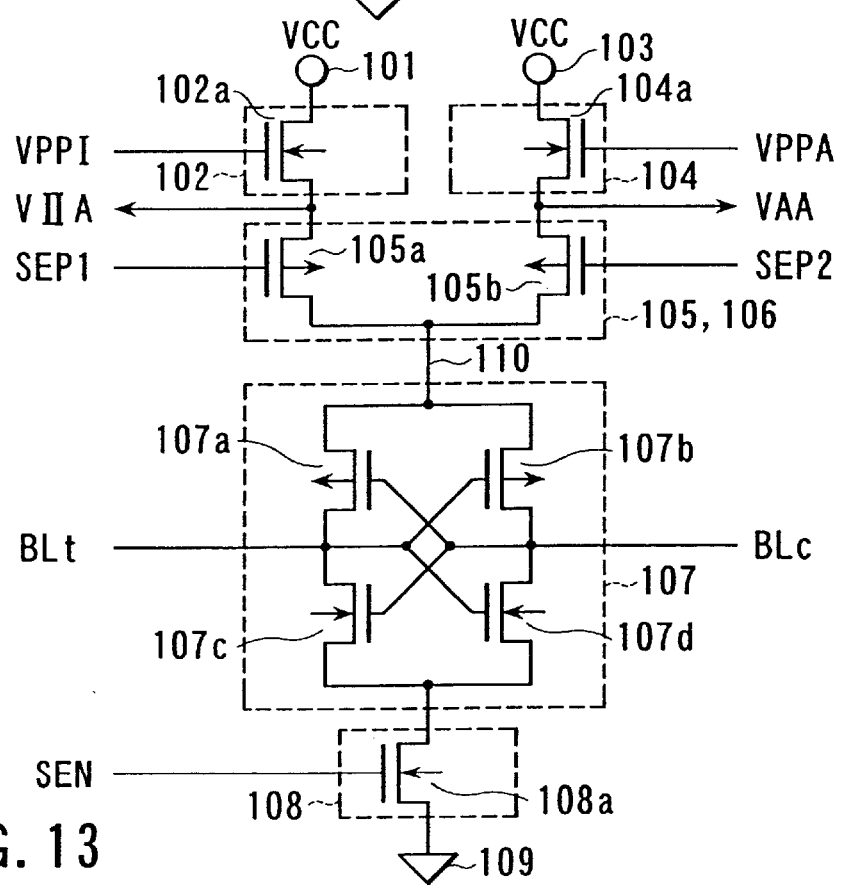
FIG. 13 is a circuit diagram showing a configuration example of the conventional overdrive circuit.
Figure 14:
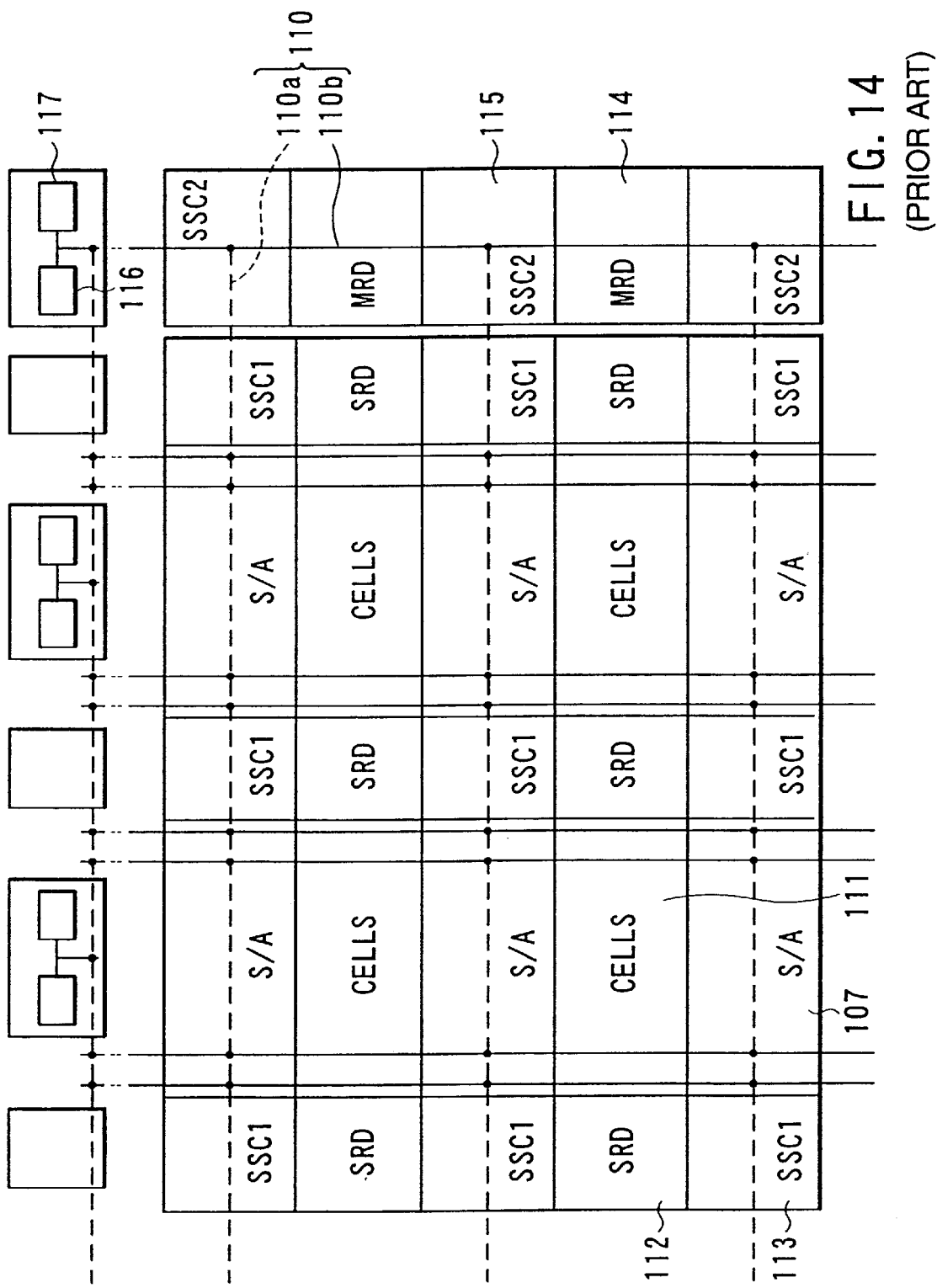
FIG. 14 is a plan view of a DRAM memory core showing an arrangement example of the conventional overdrive circuit and its power supply wiring.

FIG. 11 relates to the fourth embodiment of the present invention. This configuration example uses a booster circuit (pump circuit) to control a gate potential of the n-type MOS transistor $14_{B-1}$ of the regulator circuit 14B in FIG. 10. The n-type MOS transistor $14_{B-1}$ of the source follower type may require a high potential as the gate potential. In this case, a regulator circuit 14B' can be configured so that a booster circuit $14_{B-5}$ is used to control the n-type MOS transistor $14_{B-1}$'s gate potential.

As detailed above, the overdrive technique may be used to amplify a bit line potential. Even when the amplified bit line potential becomes too higher or lower than a restoration potential, the present invention can stabilize the restoration potential level. Accordingly, it is possible to provide a semiconductor device which can easily control the over-driven bit line potential to a desired potential.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a sense amplifier for amplifying a potential of a bit line;
   a first generation circuit for generating an overdrive potential needed for an overdrive operation of said bit line according to said sense amplifier;
   a switch circuit for controlling supply of said overdrive potential to a positive electrode of said sense amplifier; and
   a second generation circuit comprising a push-pull regulator circuit connected to said positive electrode of said sense amplifier, wherein said second generation circuit generates a restoration potential of said overdriven bit line.

2. The semiconductor device according to claim 1, wherein said first generation circuit is configured by using a dedicated power supply circuit.

3. The semiconductor device according to claim 1, wherein said push-pull regulator circuit generates said restoration potential only during a given restoration period after said overdrive operation and outputs a high impedance otherwise.

4. The semiconductor device according to claim 1, wherein said push-pull regulator circuit is configured by using a push-pull circuit comprising a p-type MOS transistor and an n-type MOS transistor serially connected to each other.

5. The semiconductor device according to claim 4, wherein operational amplifiers are connected to gates of said p-type MOS transistor and said n-type MOS transistor and said operational amplifiers produce a larger bias current at an initial stage of a restoration period than a bias current at a later stage thereof.

6. The semiconductor device according to claim 4, wherein operational amplifiers are connected to gates of said p-type MOS transistor and said n-type MOS transistor and said operational amplifiers have first transistors for a flow of bias current at an initial stage of a restoration period and second transistors smaller than said first transistors for a flow of bias current at a later stage of the restoration period.

7. The semiconductor device according to claim 1, wherein said push-pull regulator circuit is configured by using a push-pull circuit of a source follower type comprising an n-type MOS transistor and a p-type MOS transistor serially connected to each other.

8. The semiconductor device according to claim 7, wherein operational amplifiers are connected to gates of said n-type MOS transistor and said p-type MOS transistor and said operational amplifiers produce a larger bias current at an initial stage of a restoration period than a bias current at a later stage thereof.

9. The semiconductor device according to claim 1, wherein said push-pull regulator circuit is configured by using a push-pull circuit of the totem pole structure comprising an n-type MOS transistor of a source follower type and an n-type MOS transistor of a source common type serially connected to each other.

10. The semiconductor device according to claim 9, wherein operational amplifiers are connected to gates of said n-type MOS transistors: and said operational amplifiers produce a larger bias current at an initial stage of a restoration period than a bias current at a later stage thereof.

11. The semiconductor device according to claim 9, wherein said n-type MOS transistor of the source follower type uses a booster circuit to control a gate potential.

12. A semiconductor device comprising:
    a plurality of memory cell blocks arranged in a matrix;
    a plurality of sense amplifiers for amplifying a potential of a bit line;
    a plurality of main row decoders for controlling drive of one main word line for controlling selection of a plurality of word lines;
    a plurality of segment row decoders driven by selecting a specific word line from said plurality of word lines corresponding to said one main word line;
    a plurality of first generation circuits for generating an overdrive potential needed for an overdrive operation of said bit line according to said plurality of sense amplifiers;
    a plurality of switch circuits for controlling supply of said overdrive potential to respective positive electrodes of said plurality of sense amplifiers; and
    a plurality of second generation circuits comprising push-pull regulator circuits respectively connected to positive electrodes of said plurality of sense amplifiers, wherein said plurality of second generation circuits generate a restoration potential for said bit line after the overdrive operation, wherein
    said plurality of memory cell blocks and said plurality of sense amplifiers are alternately arranged in a first direction;
    said plurality of segment row decoders are arranged respectively adjacent to said plurality of memory cell blocks in a second direction orthogonal to said first direction;
    said plurality of main row decoders are arranged at one end of said second direction;
    said plurality of switch circuits are arranged in a plurality of first regions adjacent to said plurality of sense amplifiers;
    said plurality of first generation circuits are arranged at one end of said first direction; and
    said plurality of second generation circuits are arranged in a plurality of second regions adjacent to said plurality of main row decoders.

13. The semiconductor device according to claim 12, wherein said plurality of first generation circuits is configured by using respective dedicated power supply circuits.

14. The semiconductor device according to claim 12, wherein said plurality of push-pull regulator circuits generates said restoration potential only during a given restoration period after said overdrive operation and output a high impedance otherwise.

15. The semiconductor device according to claim 12, wherein said plurality of push-pull regulator circuits is configured by using a push-pull circuit comprising a p-type MOS transistor and an n-type MOS transistor serially connected to each other.

16. The semiconductor device according to claim 15, wherein operational amplifiers are connected to gates of said p-type MOS transistor and said n-type MOS transistor and said operational amplifiers produce a larger bias current at an initial stage of a restoration period than a bias:current at a later stage thereof.

17. The semiconductor device according to claim 15, wherein operational amplifiers are connected to gates of said p-type MOS transistor and said n-type MOS transistor and said operational amplifiers have first transistors for a flow of bias current at an initial stage of a restoration period and second transistors smaller than said first transistors for a flow of bias current at a later stage of the restoration period.

18. The semiconductor device according to claim 12, wherein said plurality of push-pull regulator circuits is configured by using a push-pull circuit of a source follower type comprising an n-type MOS transistor and a p-type MOS transistor serially connected to each other.

19. The semiconductor device according to claim 18, wherein operational amplifiers are connected to gates of said n-type MOS transistor and said p-type MOS transistor and said operational amplifiers produce a larger bias current at an initial stage of a restoration period than a bias current at a later stage thereof.

20. The semiconductor device according to claim 12, wherein said plurality of push-pull regulator circuits is configured by using a push-pull circuit of the totem pole structure comprising an n-type MOS transistor of a source follower type and an n-type MOS transistor of a source common type serially connected to each other.

21. The semiconductor device according to claim 20, wherein operational amplifiers are connected to gates of said n-type MOS transistors and said operational amplifiers produce a larger bias current at an initial stage of a restoration period than a bias current at a later stage thereof.

22. The semiconductor device according to claim 20, wherein said n-type MOS transistor of the source follower type uses a booster circuit to control a gate potential.

* * * * *